(12) United States Patent
Dabiri et al.

(10) Patent No.: US 7,461,328 B2
(45) Date of Patent: Dec. 2, 2008

(54) EFFICIENT DECODING

(75) Inventors: Dariush Dabiri, San Jose, CA (US); Nitin Barot, San Jose, CA (US)

(73) Assignee: Teranetics, Inc., Santa Clara, CA (US)

( * ) Notice: Subject to any disclaimer, the term of this patent is extended or adjusted under 35 U.S.C. 154(b) by 484 days.

(21) Appl. No.: 11/090,109

(22) Filed: Mar. 25, 2005

(65) Prior Publication Data

US 2006/0218458 A1    Sep. 28, 2006

(51) Int. Cl.
*H03M 13/00* (2006.01)
*H03M 13/03* (2006.01)

(52) U.S. Cl. .................. 714/794; 714/780; 714/795
(58) Field of Classification Search ................ 714/794, 714/795, 780
See application file for complete search history.

(56) References Cited

U.S. PATENT DOCUMENTS

| | | | | |
|---|---|---|---|---|
| 5,721,745 A * | 2/1998 | Hladik et al. | ............... | 714/755 |
| 6,161,209 A * | 12/2000 | Moher | ................. | 714/780 |
| 6,192,501 B1 * | 2/2001 | Hladik et al. | ............... | 714/786 |
| 6,304,995 B1 * | 10/2001 | Smith et al. | ................. | 714/786 |
| 6,654,927 B1 * | 11/2003 | Sall et al. | ..................... | 714/786 |
| 6,751,770 B2 * | 6/2004 | Morelos-Zaragoza | ....... | 714/781 |
| 6,948,109 B2 * | 9/2005 | Coe | ........................... | 714/752 |
| 7,000,177 B1 * | 2/2006 | Wu et al. | .................... | 714/801 |
| 7,010,051 B2 * | 3/2006 | Murayama et al. | .......... | 375/262 |
| 7,089,479 B2 | 8/2006 | Matsumoto | | |
| 7,120,856 B2 * | 10/2006 | Zhang et al. | ................ | 714/801 |
| 2003/0037298 A1 | 2/2003 | Eleftheriou et al. | | |

OTHER PUBLICATIONS

Engling Yeo et al, Iterative Decoding Algorithms and their Implemenation, Project Report 2001-02 for Micro Project 01-061, Nov. 2002.

Xiao-Yu Hu et al, Efficient Implementations of the Sum-Product Algorithm for Decoding LDPC codes, 2001 IEEE.

* cited by examiner

*Primary Examiner*—Joseph D Torres
(74) *Attorney, Agent, or Firm*—Brian R. Short (57) ABSTRACT

Embodiments of a method and apparatus for decoding signals are disclosed. The method includes receiving modulated signals, generating bits representing the signals, and associated reliability of each bit. The method further includes executing a first stage of decoding the bits using a first component code, and simultaneously executing the first stage of decoding again using a second component code, and executing a second stage of decoding using the first component code. The first and second stages of decoding are used to generate the bit stream.

6 Claims, 8 Drawing Sheets

EFFICIENT DECODING

FIELD OF THE INVENTION

The invention relates generally to network communications. More particularly, the invention relates to a method and apparatus for efficient decoding.

BACKGROUND OF THE INVENTION

High-speed networks are continually evolving. The evolution includes a continuing advancement in the operational speed of the networks. The network implementation of choice that has emerged is Ethernet networks physically connected over unshielded twisted pair wiring. Ethernet in its 10/100BASE-T form is one of the most prevalent high speed LANs (local area network) for providing connectivity between personal computers, workstations and servers.

High-speed LAN technologies include 100BASE-T (Fast Ethernet) and 1000BASE-T (Gigabit Ethernet). Fast Ethernet technology has provided a smooth evolution from 10 Megabits per second (Mbps) performance of 10BASE-T to the 100 Mbps performance of 100BASE-T. Gigabit Ethernet provides 1 Gigabit per second (Gbps) bandwidth with essentially the simplicity of Ethernet. There is a desire to increase operating performance of Ethernet to even greater data rates.

An implementation of high speed Ethernet networks includes simultaneous, full bandwidth transmission, in both directions (termed full duplex), within a selected frequency band. When configured to transmit in full duplex mode, Ethernet line cards are generally required to have transmitter and receiver sections of an Ethernet transceiver connected to each other in a parallel configuration to allow both the transmitter and receiver sections to be connected to the same twisted wiring pair for each of four pairs.

Figure 1:
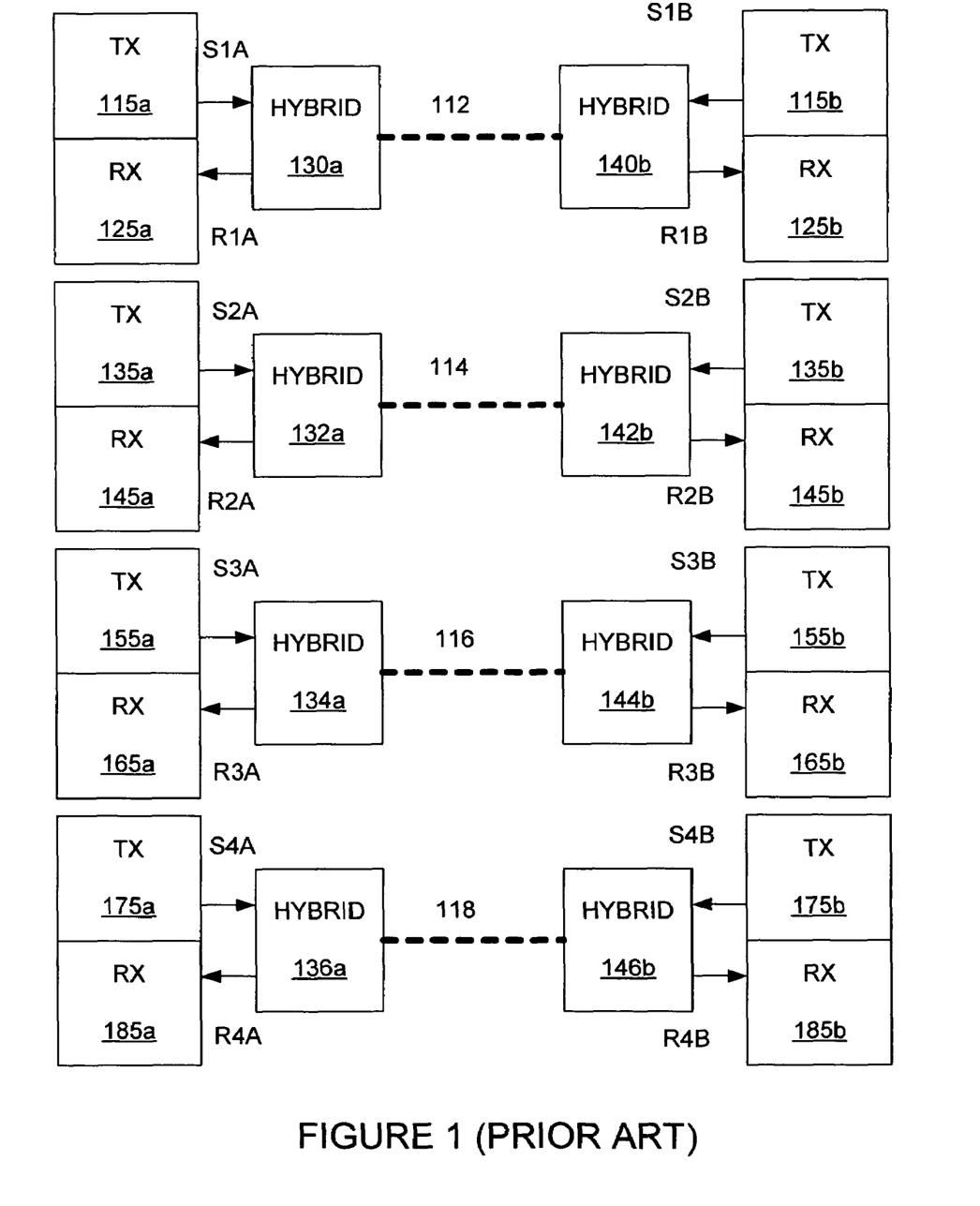
FIG. 1 shows a plurality of transceiver pairs located adjacently, and suffering from cross-talk coupling between signal streams of the transceiver pairs.

FIG. 1 shows several Ethernet twisted pair LAN connections 112, 114, 116, 118 in parallel. The first connection 112 is between a first transmitter 115a (S1A) and first receiver 125a (R1A), and a second transmitter 115b (S1B) and a second receiver 125b (R1B). The second connection 114 is between a third transmitter 135a (S2A) and third receiver 145a (R2A), and a fourth transmitter 135b (S2B) and a fourth receiver 145b (R2B). The third connection 116 is between a fifth transmitter 155a (S3A) and fifth receiver 165a (R3A), and a sixth transmitter 155b (S3B) and a sixth receiver 165b (R3B). The fourth connection 118 is between a seventh transmitter 175a (S4A) and seventh receiver 185a (R4A), and an eighth transmitter 175b (S4B) and an eighth receiver 185b (R4B). Hybrid circuits 130a, 140b, 132a, 142b, 134a, 144b, 136a, 146b are included between the transmitters and receivers.

The twisted pair LAN connections 112, 114, 116, 118 are located physically proximate, and interference between the twisted pairs 112, 114, 116, 118 is caused by interactions between signals of the twisted pair LAN connections 112, 114, 116, 118.

Information such as video, audio and data, is communicated over the networks as binary values. More specifically, the information is conveyed as zeros and ones. During transmission and processing of the information, errors can be unintentionally introduced. That is, a zero may be changed to a one, or vice versa. High speed networks, such as Gigabit Ethernet are more susceptible to these errors than slower speed networks because of the increased interference.

To provide a mechanism to check for errors and in some cases to correct errors, binary data can be coded to introduce carefully designed redundancy. Coding of a unit of data produces what is commonly referred to as a codeword. Because of its redundancy, a codeword often includes more bits that the input unit of data from which the codeword was produced.

When signals arising from transmitted codewords are received or processed, the redundant information included in the codeword as observed in the signal can be used to identify and/or correct errors in transmitted data.

A class of codes referred to as low density parity check (LDPC), has emerged for use in data transmission. LDPC codes are coding schemes that use iterative decoders. It has been shown that LDPC codes can provide very good error correction for large codewords.

Longer codewords are often more reliable at error detection and correction due to the coding interaction over a larger number of bits. The use of longer codewords can be beneficial by increasing the ability to detect and correct errors. However, a difficulty in adopting LDPC code that include long codewords is the complexity of implementing the code. LDPC coding using long codewords are significantly more complex than traditionally used coding systems such as convolution codes and Reed-Solomon codes. The added complexity requires additional power.

It is desirable to have an apparatus and method for coding and decoding high speed transmission data that is complex, but yet dissipates low power.

SUMMARY OF THE INVENTION

An embodiment of the invention includes a method of decoding signals to generate a received bit stream. The method includes receiving modulated signals, generating bits representing the signals, and associated reliability of each bit. The method further includes executing a first stage of decoding the bits using a first component code, and simultaneously executing the first stage of decoding again using a second component code, and executing a second stage of decoding using the first component code. The first and second stages of decoding are used to generate the bit stream.

Another embodiment includes another method of decoding signals to generate a received bit stream. The method includes receiving modulated signals, generating bits representing the signals, and associated reliability of each bit. The method further includes executing a first stage of N stages for decoding the bits, the first stage using a first of M component codes, and simultaneously executing a plurality of the N stages of decoding, each of the plurality of N stages using a different one of the M component codes. The plurality of N stages of decoding are used to generate the bit stream.

Other aspects and advantages of the present invention will become apparent from the following detailed description, taken in conjunction with the accompanying drawings, illustrating by way of example the principles of the invention.

DETAILED DESCRIPTION

As shown in the drawings for purposes of illustration, the invention is embodied in an apparatus and method for high performance decoding of a bit stream. The decoding can be implemented for low-power dissipation, and/or low latency.

Decoding of a received bit stream can include multiplying blocks of the bit stream (code words) by a parity matrix. A resulting parity check vector can provide an estimation of the integrity of the received bit stream. An exemplary parity matrix can be given as:

$$\begin{bmatrix} 1 & 1 & 0 & 0 & 1 & 0 & 0 \\ 0 & 1 & 1 & 0 & 0 & 1 & 0 \\ 0 & 0 & 1 & 1 & 0 & 0 & 1 \end{bmatrix}$$

An exemplary codeword that includes 7 bits of the data stream can be given as:

$$\begin{bmatrix} x_1 \\ x_2 \\ x_3 \\ x_4 \\ x_5 \\ x_6 \\ x_7 \end{bmatrix}$$

A parity check vector is determined by multiplying the codeword with the parity check matrix. More specifically, the parity check vector can be give as:

$$\begin{bmatrix} 1 & 1 & 0 & 0 & 1 & 0 & 0 \\ 0 & 1 & 1 & 0 & 0 & 1 & 0 \\ 0 & 0 & 1 & 1 & 0 & 0 & 1 \end{bmatrix} \begin{bmatrix} x_1 \\ x_2 \\ x_3 \\ x_4 \\ x_5 \\ x_6 \\ x_7 \end{bmatrix} = \begin{bmatrix} 0 \\ 0 \\ 0 \end{bmatrix}$$

For this exemplary parity check vector, a first parity condition can be satisfied if $x_1+x_2+x_5=0$, a second parity condition can be satisfied if $x_2+x_3+x_6=0$, and a third parity condition can be satisfied if $x_3+x_4+x_7=0$. The parity condition provides an indication of the integrity of the bits of the codeword of the received bit stream. The parity matrix and parity check vector provided here are for illustration purposes only.

Figure 2:
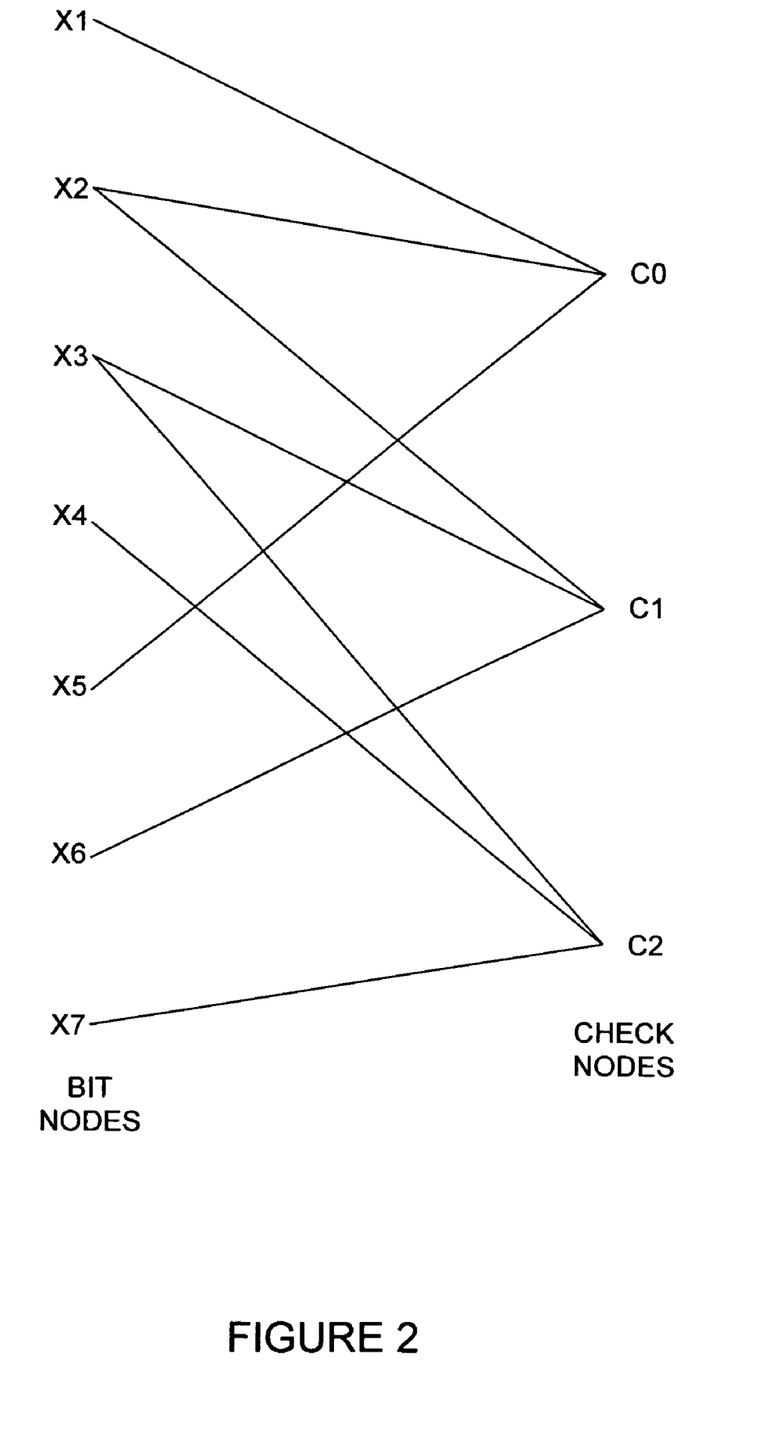
FIG. 2 shows a Tanner graph that depicts a relationship between check nodes and bit nodes.

FIG. 2 shows a Tanner graph that shows the relationship between bit nodes and check nodes of the above example. Variables C0, C1, C2 are check nodes, and represent the entries of the parity check vector. The bit nodes $x_1, x_2, x_3, x_4, x_5, x_6, x_7$ are bit nodes, and represent the entries of the codeword. As shown, the check node C0 is dependent upon the bit nodes $x_1, x_2, x_5$ the check node C1 is dependent upon the bit nodes $x_2, x_3, x_6$ the check node C2 is dependent upon the bit nodes $x_3, x_4, x_7$. the check nodes C0, C1, C2 correspond with the entries of the parity check vector. As will be described later, the values of the check nodes can be used to estimate the probabilities that the received bits $x_1, x_2, x_3, x_4, x_5, x_6, x_7$ are correct.

Tanner graphs (like the one shown in FIG. 2) of LDPC codes generally include the property that no two distinct check nodes are connected to the same two distinct bit nodes. This is an important property of LDPC codes, and ensures that the codes don't have loops of a length of less than six. There are many possible implementations of iterative codes that satisfy this property. The implementations include a parity matrix that includes loops greater than six. A loop is a path on the Tanner graph that starts at one node and ends at the same node without repeating any edge, wherein an edge is a connection between a bit node and a check node.

Figure 3:
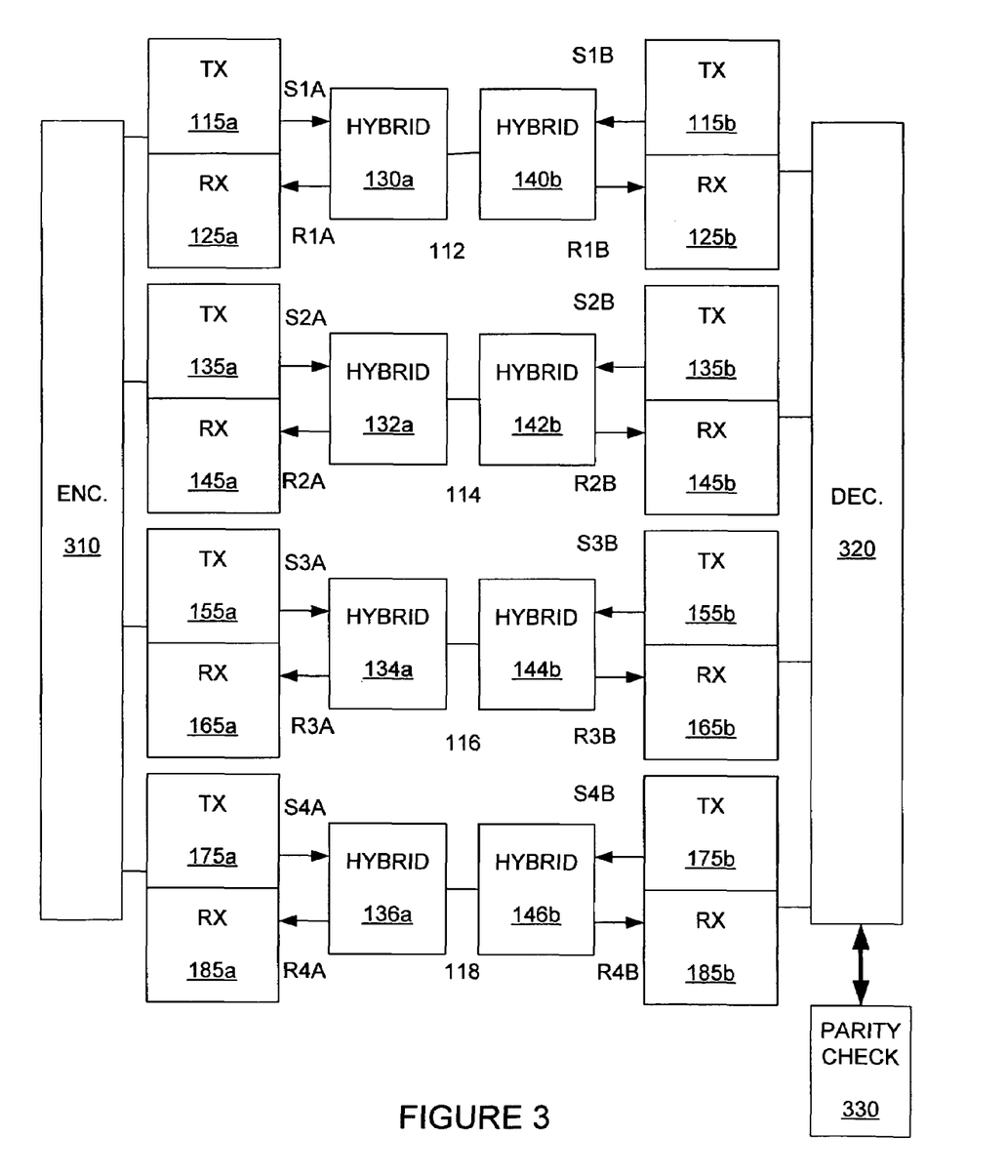
FIG. 3 shows a pair of transceivers that include an LDPC encoder and an LDPC decoder according to an embodiment of the invention.

FIG. 3 shows a pair of transceivers that include an LDPC encoder 310 and an LDPC decoder 320. Generally, LDPC decoding includes a sum product algorithm (SPA) for determining entries of a parity matrix (which can be included within a parity check 330). The complexity of the decoding is linearly dependent upon the column weight of the parity matrix, which is determined by the number non-zero entries of each column. Improvements in performance of the decoding generally requires an increase in the column weight of the parity matrix, which typically increases the complexity, power dissipation, and/or the latency of the processing of the decoding.

Decoding Phases

The above-described SPA decoding includes two decoding phases per decoding iteration. The two phases include the bit node calculations and the check node calculations. The hardware dedicated to the bit node calculations is idle while the hardware that is dedicated to the check nodes is performing check node calculations, and the hardware that is dedicated to the check node calculations is idle while the hardware that is dedicated to the bit nodes is performing bit node calculations. Therefore, hardware executing the decoding is not fully utilized, and therefore, less efficient than desired.

An iteration of decoding can be defined as including the bit node phase and the check node phase. The number of iterations for decoding received signals can be limited, or unlimited depending upon the decoding system. In practice, generally a cap is put on the maximum number of iterations. Early termination refers to a condition in which an iterative decoding algorithm is stopped before a maximum number of iterations have been executed. To achieve a desired bit error rate, a minimum number of iterations must be allocated to the decoding.

Rate of Decoding

SPA decoding is rate limited by the number of iterations, and the time required to execute each phase of decoding. More specifically, the rate of decoding can be estimated as 1/(2iT) where i is the number of iterations, and T is the time required for each decoding phase of the SPA decoding. The maximum number of iterations can be dependent upon several different constraints, but for the descriptive purposes, it is assume to be fixed. With present decoding implementations, the rate is limited by the estimate (bounds) as just described.

A Pipeline Decoder

Figure 4:
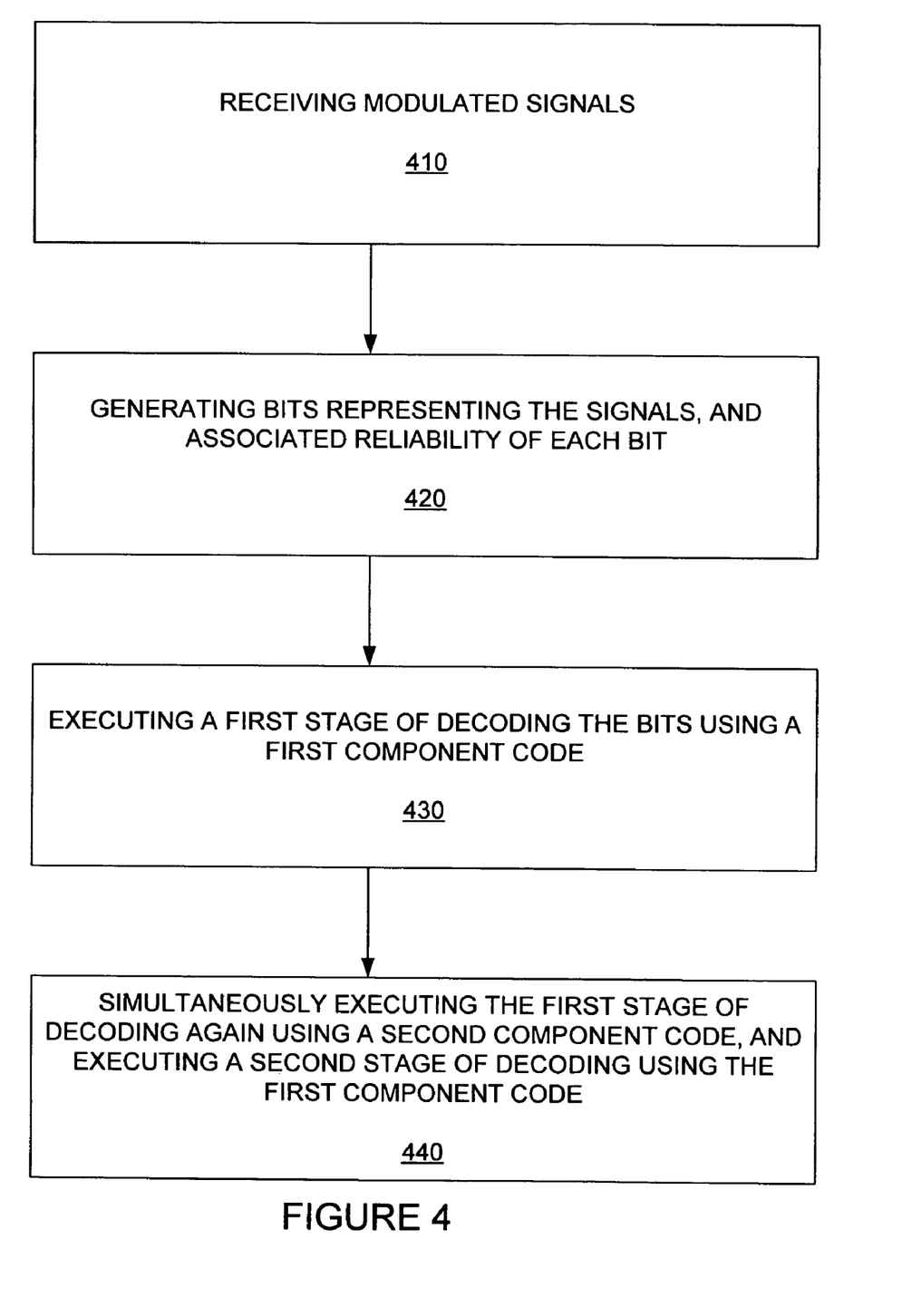
FIG. 4 is a flow chart showing steps included within a pipeline decoder that includes multiple component codes.

FIG. 4 is a flow chart that shows step included within a pipeline decoder that includes multiple component codes. As will be described, embodiments of this decoding provides for an increased number of decoding stages, while maintaining latency time. A first step 410 includes receiving modulated signals. A second step 420 includes generating bits representing the signals, and associated reliability of each bit. A third step 430 includes executing a first stage of decoding the bits using a first component code. A fourth step 440 includes simultaneously executing the first stage of decoding again using a second component code, and executing a second stage of decoding using the first component code. The first and second stages of decoding are used to generate the bit stream. The reception of the modulated signals of the first step 410 can be implemented by electronic circuitry that is either is located in a separate integrated circuit or located in a common integrated circuit as the decoding circuitry of the second, third or fourth steps 420, 430, 440.

Figure 5:
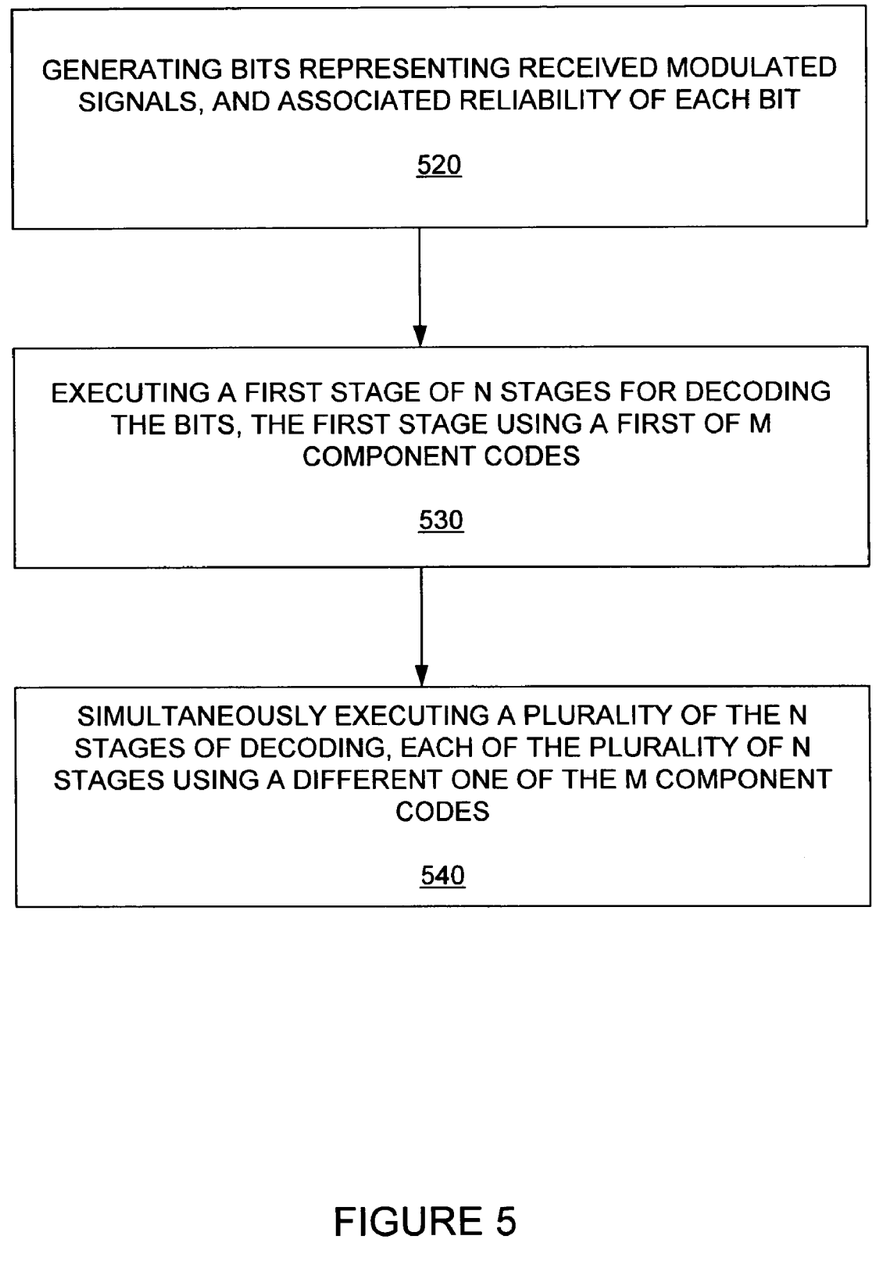
FIG. 5 is a flow chart showing steps included within a general pipeline decoder that includes M component codes and N stages.

FIG. 5 is a flow chart showing steps included within a general pipeline decoder that includes M component codes and N stages. The number of component codes M will always be greater than the number of stages N. A first step 520 includes generating bits representing received modulated signals, and associated reliability of each bit. A second step 530 includes executing a first stage of N stages for decoding the bits, the first stage using a first of M component codes. A third step 540 includes simultaneously executing a plurality of the N stages of decoding, each of the plurality of N stages using a different one of the M component codes. The plurality of N stages of decoding are used to generate the bit stream.

Component Codes

The decoding of FIGS. 4, 5 include component codes. Component codes are codes that are defined by a proper subset of parity check conditions (that is, a subset of a parity check matrix) of an original code. A component code can include row of the previously described parity matrix. For example, the previously described parity matrix includes three rows. An exemplary first component code can include the first two rows, and an exemplary second component code can include the third row. Generally, the component codes can each include any number of rows of the corresponding parity check matrix.

Component Code Selection

Each set of check nodes defines a corresponding component code. Various conditions and parameters can be used to select the component codes. As previously described, each of the component codes can be a subset of rows of the parity matrix.

Component code selections can be made so that characteristics of the parity check matrix of the component codes are maintained. For example, the component codes can be selected so that column weights of a parity check matrix of the component codes are non-zero. This can be an advantageous selection because this selection avoids error patterns effecting bits corresponding to zero weight columns of the parity check matrix, from slowing down convergence of the decoding algorithm or process. Zero weight parity check matrix columns can cause bits being decoded to become stuck on incorrect values. Therefore, bit error rate (BER) for a given number of decoding iterations is typically better.

The component codes can be selected so that each component code comprises a regular LDPC, and column weights of a parity matrix of the component codes are a pre-selected value. Making the column weights a common pre-selected value generally results in simpler hardware configurations required to implement the decoding. Note that a regular LDPC is an LDPC in which the column weights of the parity check matrix are all the same. Another embodiment includes column weights of a parity matrix of the component codes having pre-selected values that are not all the same. Generally, however, this embodiment leads to less efficient hardware implementations. When the pre-selected values are the same, the hardware implementing the decoding is typically more structured. That is, the hardware of each stage is more repetitive, and therefore, easier to implement.

The component codes can be selected so that a parity check matrix of the component codes has column weights of one. This configuration generally provides the maximum number of component codes and the maximum number of stages. This configuration is most ideal for maximum clock rates, and therefore, greater throughput than other decoding configurations.

Pipeline Decoding

Figure 6:
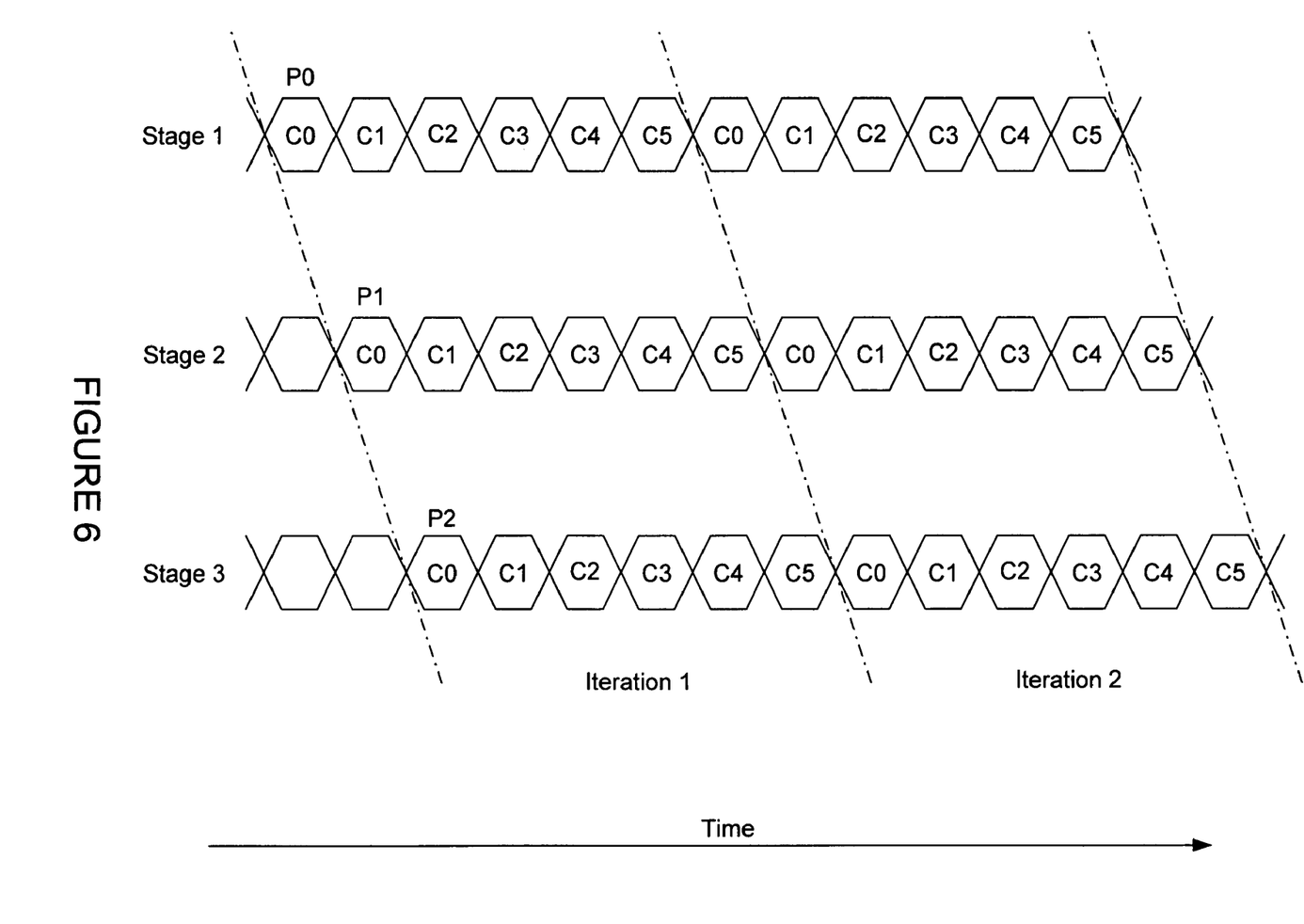
FIG. 6 shows time lines of several stages of pipelined decoding that includes multiple component codes.

FIG. 6 shows time lines of several stages of pipelined decoding that includes multiple component codes. As shown, iterations (FIG. 6 depicts two iterations) of the decoding can include each of the available stages executing all of the possible component codes. This embodiment includes six component codes C0, C1, C2, C3, C4, C5. However, any number of component codes can be used for the pipeline decoding. Each stage of the decoding executes a decoding phase. Three phases P0, P1, P2 are shown in FIG. 6. The embodiment of FIG. 6 includes three stages corresponding to three decoding phases. The number of stages and corresponding decoding phases can be selected depending upon the required throughput, decoding complexity, clock rate, and characteristic of integrated circuit technology. A decoder utilizing a fast clock when the decoder is implemented with a slow speed integrated circuit technology, typically requires more pipeline stages. The number of component codes is greater than or equal to the number of pipeline stages.

Figure 7:
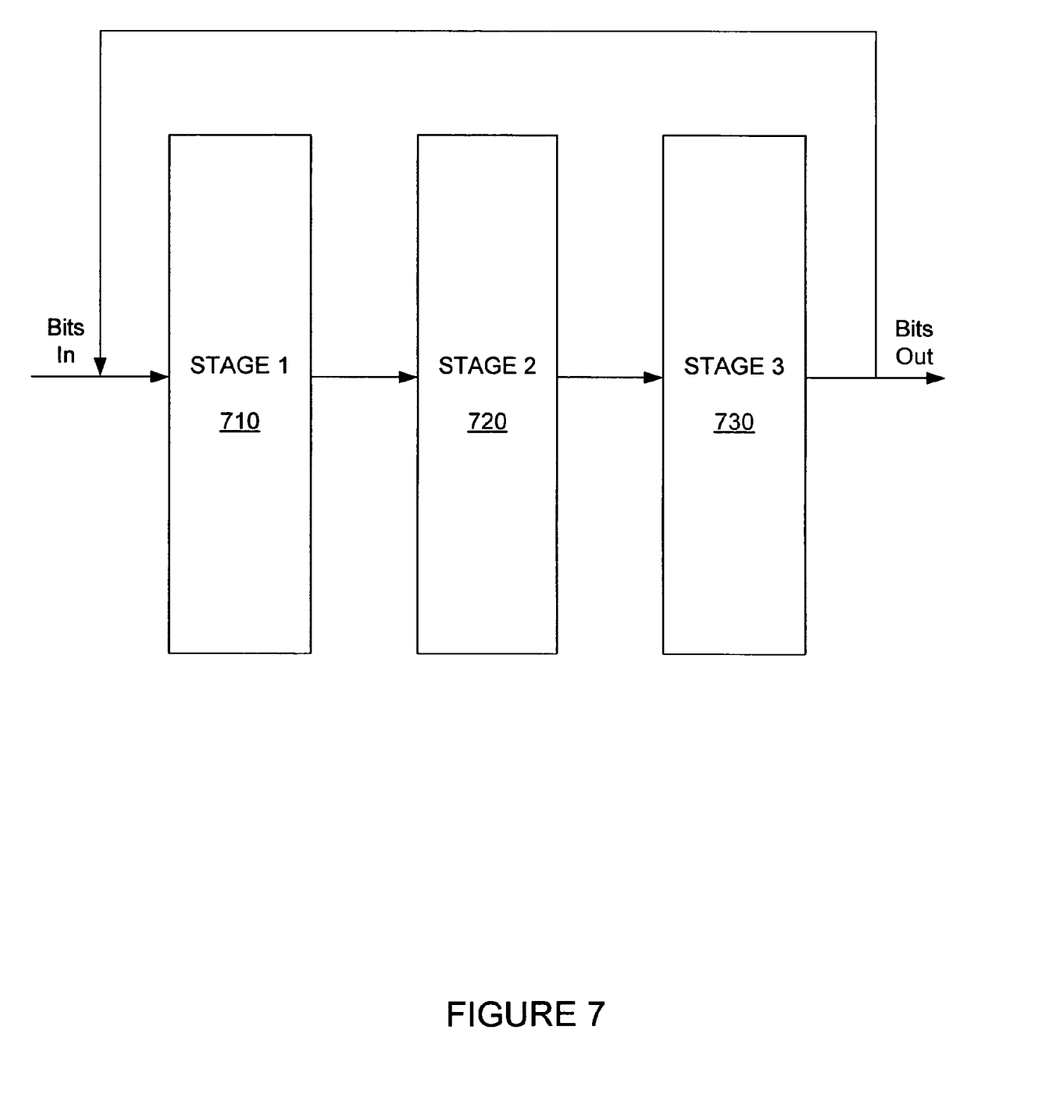
FIG. 7 is a block diagram of a pipeline decoder.

FIG. 7 is a block diagram of a pipeline decoder. This exemplary pipeline decoder includes three stages 710, 720, 730. The pipeline decoder receives bits (Bits In) for decoding and the associated reliability of the bits. The pipeline decoder generates decoded bits and associated reliability (Bits Out). The hardware of each stage maps the predetermined component codes into the hardware. During decoding, essentially all of the stages 710, 720, 730 are simultaneously operating, each operating on different one of the component codes. As previously stated, the number of component codes must be greater than the number of stages to prevent any one stage from "starving".

FIG. 6 is useful in understanding the operation of the pipeline decoder of FIG. 7. Each stage 710, 720, 730 is simultaneously operating on a different one of the component codes. An output of bits and associated reliability is generated after an iteration of decoding. Each iteration includes all stages executing all of the component codes. FIG. 6 shows an exemplary time of the operations of each of the stages 710, 720, 730.

The decoding embodiments of FIGS. 4, 5, 6, 7 are more efficient than typical SPA decoders because multiple decoding phases are being executed simultaneously. Therefore, the hardware dedicated to each of the decoding phase sits idle for a minimal amount of time.

Latency

The pipeline decoding structure of FIGS. 6, 7 provides a minimal amount of latency for a given integrated circuit technology without degrading the throughput of the decoder. An alternate decoding approach that provides the same throughput for the same integrate circuit technology includes allowing the decoder to process multiple codeword simultaneously. However, this decoding results in higher latency because it takes longer for a given codeword to be processed by the decoding because two or more codewords share the same decoding hardware.

A Network of Devices

Figure 8:
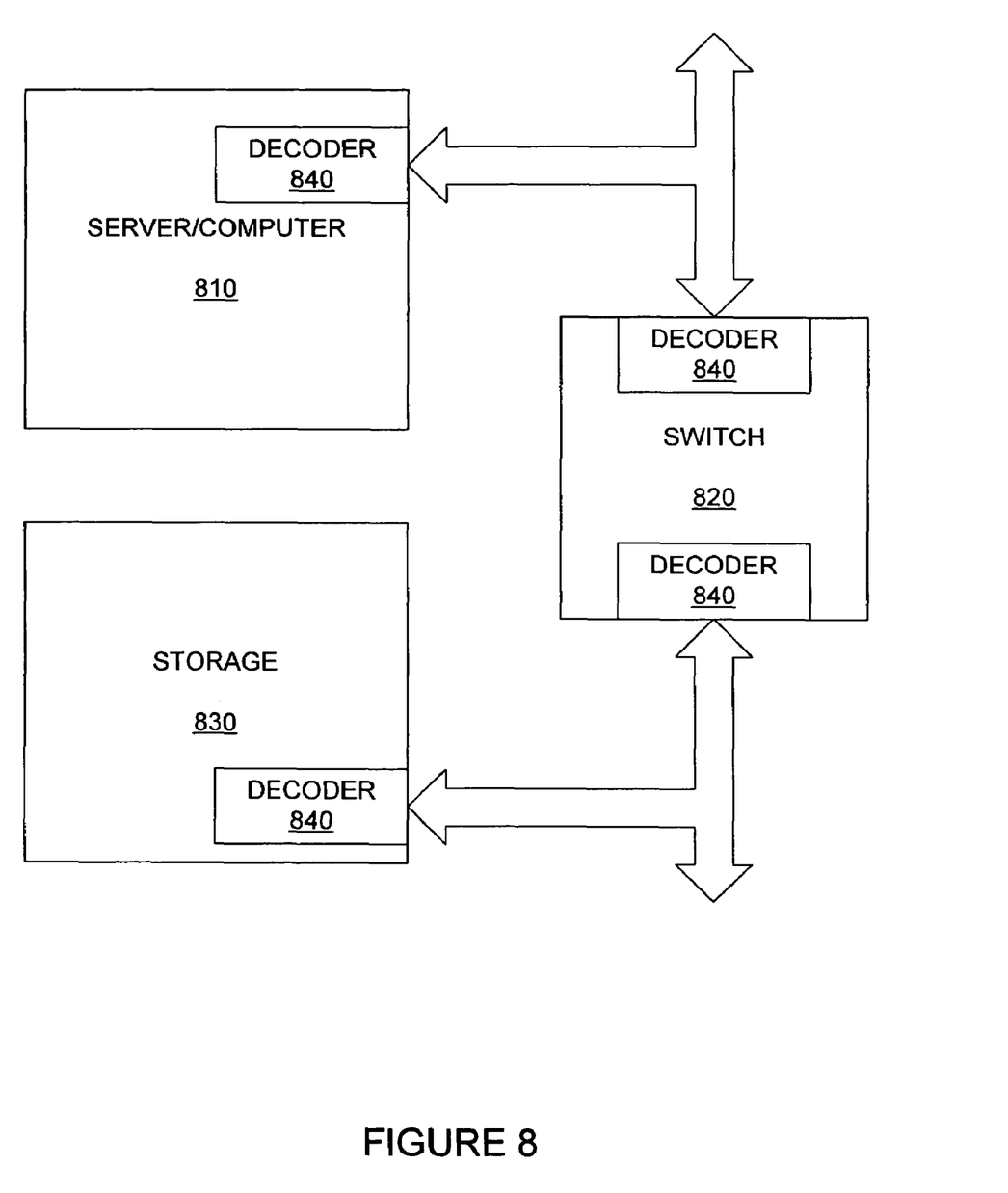
FIG. 8 shows devices connected to an Ethernet network that can include embodiments of the decoding

FIG. 8 shows devices connected to an Ethernet network that can include embodiments of the decoding. The network includes a server/computer 810, a switch 820 and storage 830 that can all benefit from the use of a low-power decoder 840. The server/computer 810 can be connected to the switch 820 through an Ethernet twisted pair LAN connection. The switch 820 can additionally be connected to the storage 830 through an Ethernet twisted pair LAN connection. The low-power decoders 840 within the server/computer 810, the switch 820, and the storage 830 can provide minimization of ISI and FEXT interference of the Ethernet twisted pair LAN connections.

Although specific embodiments of the invention have been described and illustrated, the invention is not to be limited to the specific forms or arrangements of parts so described and illustrated. The invention is limited only by the appended claims.

What is claimed:

1. A method of decoding signals to generate a received bit stream, comprising:

receiving modulated signals;

generating bits representing the signals, and associated reliability of each bit;

operating a first stage of N series-connected decoder stages for decoding the bits, the first stage operating using a first of M component codes; and operating the N series-connected decoder stages simultaneously, each of the N series-connected decoder stages operating using a different one of M component codes, wherein each of the N series-connected decoder stages use all M component codes for each iteration of decoding, wherein M is at least as great as N, and wherein N is greater than two; and wherein the plurality of N stages of decoding are used to generate the bit stream.

2. The method of claim 1, wherein column weights of a parity check matrix of the component codes are non-zero.

3. The method of claim 1, wherein each component code comprises a regular LDPC, and column weights of a parity matrix of the component codes are pre-selected values.

4. The method of claim 3, wherein the pre-selected values are all the same.

5. The method of claim 4, wherein hardware implementing the N series-connected decoder stages includes a repeated structure.

6. The method of claim 5, wherein a parity check matrix of the component codes has column weights of one.

* * * * *